(12) United States Patent
Kurita et al.

(10) Patent No.: US 7,745,854 B2
(45) Date of Patent: Jun. 29, 2010

(54) SUBSTRATE FOR GROWING COMPOUND SEMICONDUCTOR AND EPITAXIAL GROWTH METHOD

(75) Inventors: Hideki Kurita, Kitaibaraki (JP); Ryuichi Hirano, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 0 days.

(21) Appl. No.: 12/223,453

(22) PCT Filed: Feb. 2, 2007

(86) PCT No.: PCT/JP2007/051764

§ 371 (c)(1),
(2), (4) Date: Jul. 31, 2008

(87) PCT Pub. No.: WO2007/088958

PCT Pub. Date: Aug. 9, 2007

(65) Prior Publication Data
US 2009/0025629 A1    Jan. 29, 2009

(30) Foreign Application Priority Data

Feb. 2, 2006    (JP) .............................. 2006-026199

(51) Int. Cl.
*H01L 29/94* (2006.01)
*C30B 23/00* (2006.01)
*C30B 28/12* (2006.01)

(52) U.S. Cl. ........................ 257/200; 257/201; 438/795; 117/83; 117/84; 117/85; 117/86; 117/87; 117/101

(58) Field of Classification Search ................. 117/101, 117/83–87; 372/45.1; 438/795; 257/200–201
See application file for complete search history.

(56) References Cited

U.S. PATENT DOCUMENTS

| 5,569,954 | A | 10/1996 | Hata et al. | |
| 5,647,917 | A * | 7/1997 | Oida et al. | 148/33.4 |
| 6,797,532 | B2 * | 9/2004 | Ueda | 438/46 |
| 7,338,902 | B2 * | 3/2008 | Nakamura et al. | 438/681 |
| 7,442,355 | B2 * | 10/2008 | Kawase | 423/328.2 |

FOREIGN PATENT DOCUMENTS

| JP | 61-70180 A | 4/1986 |
| JP | 62-226891 A | 10/1987 |

(Continued)

*Primary Examiner*—G. Nagesh Rao
(74) *Attorney, Agent, or Firm*—Birch, Stewart, Kolasch & Birch, LLP

(57) ABSTRACT

It is to provide a substrate for growing a semiconductor, which is effective for suppressing an occurrence of surface defects different in type from hillock defects in case of epitaxially growing a compound semiconductor layer, particularly an Al-based compound semiconductor layer.

In a substrate for growing a compound semiconductor, in which a crystal surface inclined at a predetermined off angle with respect to a (100) plane is a principal plane, an angle made by a direction of a vector obtained by projecting a normal vector of the principal plane on the (100) plane and one direction of a [0-11] direction, a [01-1] direction, a [011] direction and a [0-1-1] direction is set to be less than 35°, and the compound semiconductor layer is epitaxially grown on the substrate.

4 Claims, 2 Drawing Sheets

FOREIGN PATENT DOCUMENTS

| | | | |
|---|---:|---|---:|
| JP | 64-82525 A | | 3/1989 |
| JP | 01239188 A | * | 9/1989 |
| JP | 6-92278 B2 | | 11/1994 |
| JP | 7-6957 A | | 1/1995 |
| JP | 7-193007 A | | 7/1995 |
| JP | 8-37293 A | | 2/1996 |
| JP | 2750331 B2 | | 2/1998 |
| JP | 11-003989 A | | 1/1999 |
| JP | 11003989 A | * | 1/1999 |
| JP | 3081706 B2 | | 6/2000 |
| JP | 3129112 B2 | | 11/2000 |
| JP | 2002-273647 A | | 9/2002 |
| JP | 2004-339003 A | | 12/2004 |

* cited by examiner (100) PLANE

| USUAL NOTATION | NOTATION IN DESCRIPTION AND CLAIMS |
|---|---|
| [01$\bar{1}$] | [01-1] |
| [0$\bar{1}\bar{1}$] | [0-1-1] |
| [0$\bar{1}$1] | [0-11] |

SUBSTRATE FOR GROWING COMPOUND SEMICONDUCTOR AND EPITAXIAL GROWTH METHOD

CROSS REFERENCE TO RELATED APPLICATIONS

This corresponding application Ser. No. 12/223,453 claims benefit of priority and national stage entry to PCT/JP2007/051764.

TECHNICAL FIELD

The present invention relates to an epitaxial growth technology for a compound semiconductor layer, and particularly relates to a substrate for growing a compound semiconductor, which is used in epitaxial growth.

BACKGROUND ART

Heretofore, as a semiconductor element such as a light-emitting element and a light-receiving element, a semiconductor wafer in which a III-V compound semiconductor layer such as an InP layer is epitaxially grown on an InP substrate, has been widely used. Such an epitaxial layer composed of this compound semiconductor is formed by, for example, a metal organic chemical vapor deposition method (hereinafter, referred to as an MOCVD method).

Incidentally, in case that the above-described III-V compound semiconductor layer is epitaxially grown by the MOCVD method, there has been a problem that minute protrusion defects called hillocks and wrinkle defects called orange peels occurred on a surface of the epitaxial layer, and that the surface morphology of the epitaxial layer was deteriorated. Accordingly, a variety of technologies for improving the surface morphology of the epitaxial layer have been proposed (Patent Documents 1 to 3).

For example, in Patent Document 1, there has been proposed a method of using a wafer having an off angle of 0.1 to 0.2° from a [100] direction as a substrate for epitaxial growth, and of carrying out the epitaxial growth under a condition where the substrate temperature is 600° C. or higher and 700° C. or lower. This method is successful in remarkably reducing the hillock defects (referred to as tear-shaped defects in Patent Document 1) caused on the surface of the epitaxial layer.

Moreover, in Patent Document 2, there has been proposed an epitaxial growth method in which a range of the off angle is determined by an arithmetic function of the growth rate and the substrate temperature in order to prevent the orange peels from occurring in case where the off angle of the substrate is increased. By this method, it is possible to greatly reduce the hillock defects caused on the surface of the epitaxial layer, and this method is successful in preventing the occurrence of the orange peels.

Furthermore, in Patent Document 3, there has been proposed a method of determining the off angle of the substrate in consideration of a defect density (dislocation density) of the substrate. Specifically, in case of epitaxially growing a thin film of the compound semiconductor on the InP substrate, a substrate in which the off angle θ (°) from the [100] direction satisfies: $\theta \geq 1 \times 10^{-3} D^{1/2}$ (D (cm$^{-2}$): defect density of substrate) is used. For example, in case that the defect density D of the substrate is 1000 cm$^{-2}$, a substrate in which the off angle θ is equal to or larger than 0.03 is used, and in case that the defect density D of the substrate is 1000 cm$^{-2}$, a substrate in which the off angle θ is equal to or larger than 0.10 is used.

Meanwhile, with regard to an epitaxial growth technology for a silicon single crystal film, there have been proposed technologies for determining not only the off angle of the substrate for growing a semiconductor with respect to a reference plane (for example, a (100) plane) but also an inclination direction thereof in order to reduce an occurrence of minute irregularities and other defects on the surface of the epitaxial layer (Patent Documents 4 to 7).

Patent Document 1: Japanese Examined Patent Publication No. Heisei 6-92278

Patent Document 2: Japanese Patent No. 2750331

Patent Document 3: Japanese Patent No. 3129112

Patent Document 4: Japanese Patent No. 1786503

Patent Document 5: Japanese Patent No. 3081706

Patent Document 6: Japanese Patent Laid-Open Publication No. 2002-273647

Patent Document 7: Japanese Patent Laid-Open Publication No. 2004-339003

DISCLOSURE OF THE INVENTION

Problem to be Solved by the Invention

Heretofore, with regard to the epitaxial growth technology for the III-V compound semiconductor layer, the substrate for growing the semiconductor, in which the off angle and the dislocation density of a principal plane (growth plane) are defined as in the above-described Patent Documents 1 to 3 was used, and further, vapor phase growth was carried out under predetermined growth conditions. Thereby, it was possible to grow a practical epitaxial layer in which the surface morphology was good. Specifically, by the technologies disclosed in the above-described Patent Documents 1 to 3, the hillock defects which may occur owing to the plane orientation and the substrate dislocation of the substrate for growing the semiconductor could be reduced effectively.

However, when the inventors epitaxially grew a variety of the compound semiconductor layers by using the technologies disclosed in the above-described Patent Documents 1 to 3, it was found that surface defects different in type from the hillock defects which were noticeable heretofore, occurred. The surface defects different in type from the hillock defects are defects having an elongated shape like a needle, and it was found that this type of the surface defects easily occurred particularly when an Al-based compound semiconductor layer (for example, InAlAs layer and the like) developed actively in recent years was epitaxially grown.

It is an object of the present invention to provide a substrate for growing a semiconductor and an epitaxial growth method, which are effective for suppressing the occurrence of the surface defects different in type from the hillock defects in case of epitaxially growing the compound semiconductor layer, and particularly, the Al-based compound semiconductor layer.

Means for Solving the Problem

The present invention has been made in order to solve the above-described problem. In a substrate for growing a compound semiconductor, a crystal surface inclined at a predetermined off angle with respect to a (100) plane is a principal plane, wherein an angle made by a direction of a vector obtained by projecting a normal vector of the principal plane on the (100) plane and one direction of a [0-11] direction, a [01-1] direction and a [0-1-1] direction is less than 35°. The substrate for growing the semiconductor, in which the principal plane is inclined in the specific direction as described above, is used, and the compound semiconductor layer is epitaxially grown on the substrate. Thereby, the surface defects (in particular, the surface defects different in type from the hillock defects) of the epitaxial layer can be reduced.

Here, with regard to how to express the directions, in case where a value of the direction is negative, the negative direction is generally expressed by adding "−" above a numerical character. However, in this description and claims, the negative direction is expressed by adding "−" in front of the numerical character. Specifically, a correspondence relationship between the usual notation and the notation in this description and claims is shown in FIG. 3.

In the present invention, the shift angle β is defined by taking one of the [0-11] direction, the [01-1] direction, the [011] direction and the [0-1-1] direction as a reference. However, it is needless to say that the shift angle β can be defined by taking another direction (for example, a [001] direction, a [00-1] direction, a [010] direction, a [0-10] direction or the like) as the reference.

Moreover, in order to prevent the occurrence of the hillock defects on the surface of the epitaxial layer, it is preferable that the above-described predetermined off angle β within a range of 0.05 to 0.2°.

Moreover, the present invention is effective in case that the above substrate is applied to the III-V compound semiconductor substrate such as the InP substrate, and is particularly effective in case of epitaxially growing the Al-based compound semiconductor layer such as the InAlAs layer on the substrate.

Here, the off angle and the inclination direction of the substrate for growing the semiconductor will be explained with reference to FIG. 1. In FIG. 1, reference symbol W denotes a substrate for growing the semiconductor, in which a principal plane is sliced so as not to be parallel to the (100) plane.

At this time, an angle made by a normal vector n of the substrate W and a normal direction [100] of the (100) plane is an off angle α. Moreover, a vector obtained by projecting the normal vector n of the principal plane on the (100) plane is a vector p. A direction of this vector p can be said to be an inclination direction of the substrate. For example, when the [01-1] direction is taken as the reference, the inclination direction can be specified by an angle β (hereinafter, referred to as a shift angle) made by the vector p and the [01-1] direction.

Hereinafter, the process for achieving the present invention will be described.

First, when the inventors epitaxially grew a variety of the compound semiconductor layers by using the technologies disclosed in the above-described Patent Documents 1 to 3, it was found that new surface defects different in type from the hillock defects which were noticeable heretofore, occurred. Moreover, it was found that the new surface defects easily occurred particularly when the Al-based compound semiconductor layer (for example, InAlAs and the like) was epitaxially grown.

Then, the inventors referred to the technologies regarding silicon epitaxial growth, which are disclosed in the above-described Patent Documents 4 to 7, considered that there were some relationship between the inclination direction of the substrate for growing the semiconductor and the surface defects of the epitaxial layer also in the epitaxial growth of the compound semiconductor layer, and studied the relationship between the inclination direction of the substrate for growing the semiconductor and the above-described surface defects.

Specifically, the substrate for growing the semiconductor, in which by taking the [01-1] direction as the reference, the angle β (refer to FIG. 1) made by the [01-1] direction and the vector p obtained by projecting the normal vector n of the principal plane on the (100) plane was changed within a range of 0° to 50°, was used. Then, on the substrate for growing the semiconductor, the compound semiconductor layer was epitaxially grown. At this time, the off angle of the principal plane with respect to the (100) plane was set at 0.10° and 0.15° so that the hillock defects caused by the off angle of the substrate for growing the semiconductor could not occur. Moreover, as the substrate for growing the semiconductor, an S-doped InP substrate was used, and the InAlAs layer was epitaxially grown as the compound semiconductor layer.

Table 1 is a table showing an occurrence situation of the above-described surface defects with respect to the shift angle β. In Table 1, symbol ○ indicates that no surface defects occurred, and symbol x indicates that the surface defects occurred. From Table 1, it is understood that the above-described surface defects occur when the shift angle β exceeds 35°. Note that the occurrence of the hillock defects was not observed regardless of the shift angle β.

TABLE 1

| Shift angle (°) | Off angle with respect to (100) plane | |
| --- | --- | --- |
| | 0.10° | 0.15° |
| 0 | ○ | ○ |
| 5 | ○ | ○ |
| 10 | ○ | ○ |
| 15 | ○ | ○ |
| 20 | ○ | ○ |
| 25 | ○ | ○ |
| 30 | ○ | ○ |
| 35 | X | X |
| 40 | X | X |
| 45 | X | X |
| 50 | X | X |

As a result of further repeating the experiment, similar results to those in Table 1 were obtained also in case where the shift angle β was set in a negative direction by taking the [01-1] direction as the reference. From the above, the inventors found that it was effective to use the substrate for growing the semiconductor, in which the shift angle β was within a range of 0≦β<35° in order to reduce the above-described surface defects which occurred on the epitaxial layer.

Moreover, also in case where the [0-11] direction, the [011] direction or the [0-1-1] direction was taken as the reference, the above-described surface defects which occurred on the epitaxial layer could be reduced by using the substrate for growing the semiconductor, in which the shift angle β was within a range of −35°<β<35°, in a similar way to the case where the [01-1] direction was taken as the reference.

The present invention is made based on the above-described findings, and relates to the substrate for growing the semiconductor, which comprises the principal plane inclined in the specific direction. Specifically, the compound semiconductor layer may be epitaxially grown by using a substrate for growing a semiconductor, in which the vector p obtained by projecting the normal vector n of the principal plane on the (100) plane is positioned within hatched regions shown in FIG. 2.

EFFECT OF THE INVENTION

In accordance with the present invention, in a substrate for growing a compound semiconductor, in which a crystal surface inclined at a predetermined off angle with respect to a (100) plane is a principal plane, an angle made by a direction of a vector obtained by projecting a normal vector of the principal plane on the (100) plane and one direction of a [0-11] direction, a [01-1] direction, a direction and a [0-1-1] direction is set to be less than 35°, and the compound semiconductor layer is epitaxially grown on the substrate. Accordingly, the occurrence of the surface defects other than the hillock defects can be reduced, and an epitaxial layer having extremely good quality can be obtained.

BEST MODE FOR CARRYING OUT THE INVENTION

Figure 1:
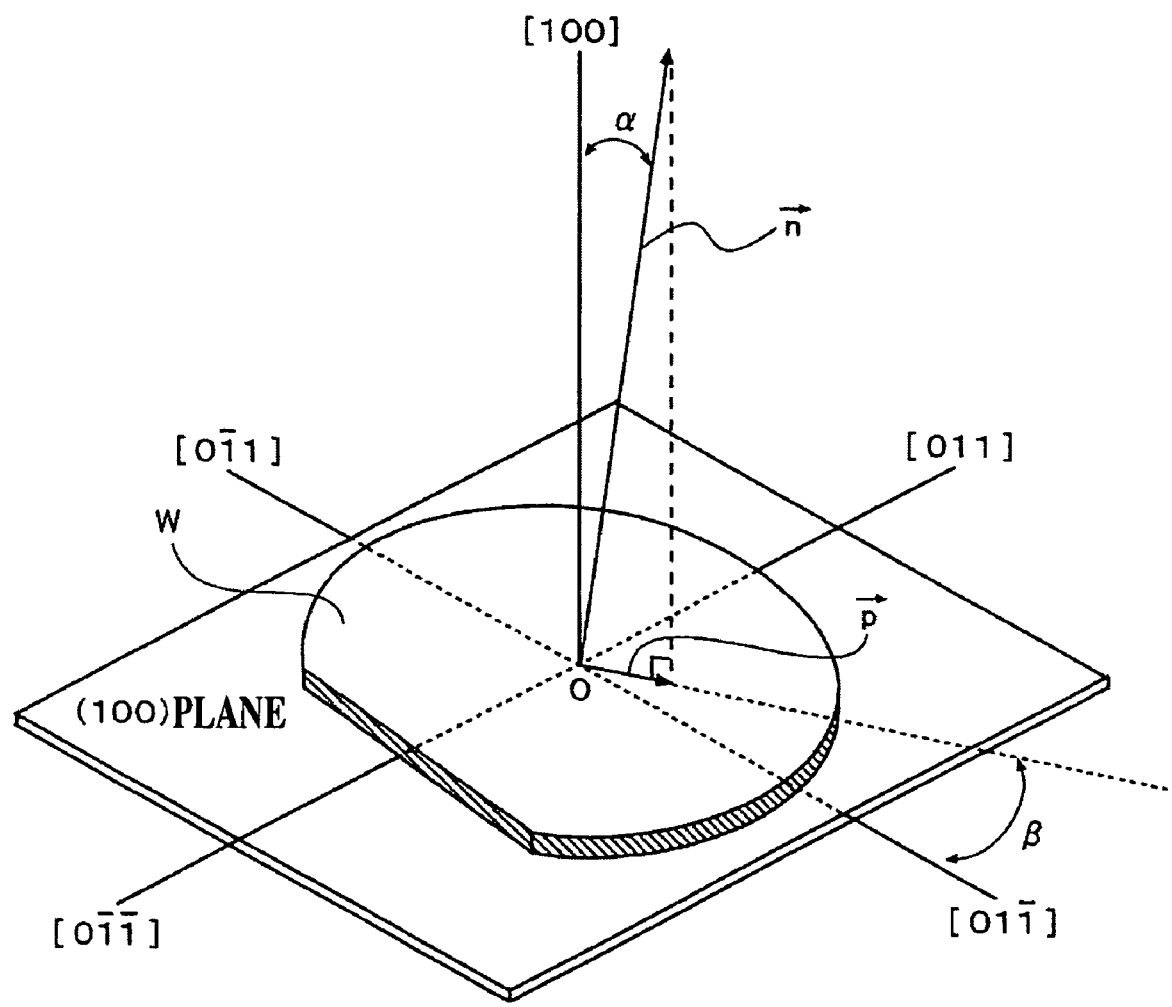
FIG. 1 This is an explanatory view showing an off angle and an inclination direction of a substrate for growing a semiconductor.

Hereinafter, a preferred embodiment of the present invention will be explained based on the drawings.

Example

First, S-doped InP single crystals in each of which a plane orientation was (100) and a diameter was 2 inches were prepared by a liquid encapsulated Czocharlski (LEC) method, and substrates for epitaxial growth were prepared by cutting the InP single crystals so as to have the predetermined off angle from the [100] direction and the predetermined shift angle β from the [01-1] direction. Then, the surfaces of the InP single crystal substrates were mirror-finished by a usual method, and InP substrates in which the off angles from the [100] direction were 0.1°, the shift angles β from the [01-1] direction were 0, 5, 10, 15, 20, 25 and 30° respectively, S-doping concentrations were $4 \times 10^{18}$ cm$^{-3}$, and the thicknesses were 350 μm, were prepared.

By using the InP substrates, the InAlAs epitaxial crystal layers were grown to 1 μm by the MOCVD method, and surface states of the epitaxial layers were observed. As a result, in the obtained epitaxial crystal layers, either the hillock defects or the surface defects different in type from the hillock defects were not observed, and the surface states were extremely good.

Comparative Example

In a similar way to Example described above, substrates for epitaxial growth were prepared, and the surfaces of the InP single crystal substrates were mirror-finished by the usual method, and InP substrates in which the off angles from the [100] direction were 0.1°, the shift angles β from the [01-1] direction were 35, 40, 45 and 50° respectively, the S-doping concentrations were $4 \times 10^{18}$ cm$^{-3}$, and the thicknesses were 350 μm, were prepared.

By using the InP substrates, the InAlAs epitaxial crystal layers were grown to 1 μm by the MOCVD method, and surface states of the epitaxial layers were observed. As a result, in the obtained epitaxial crystal layers, the hillock defects were not observed. However, the surface defects different in type from the hillock defects were observed.

As described above, the InP substrate in which the off angle of the principal plane was 0.1° and the shift angle from the [0-11] direction was within the range of 0≦β≦35, was used, and the InAlAs compound semiconductor layer was epitaxially grown on the InP substrate. Thereby, the surface defects other than the hillock defects could be also reduced, and the epitaxial layer having extremely good quality could be obtained.

As described above, the present invention made by the inventors is specifically explained based on the embodiment. However, the present invention is not limited to the above-described embodiment, and can be modified without departing from the gist thereof.

For example, although the InP substrate in which the shift angle from the [01-1] direction is within the range of 0≦β<35 is used in the above-described embodiment, a similar effect can be obtained also in case where the shift angle β is set in the negative direction by taking the [01-1] direction as the reference. Specifically, the above-described surface defects which occur on the epitaxial layer can be reduced by using the InP substrate in which the shift angle β from the [01-1] direction is within the range of −35°<β<35°.

Figures 2, 3:
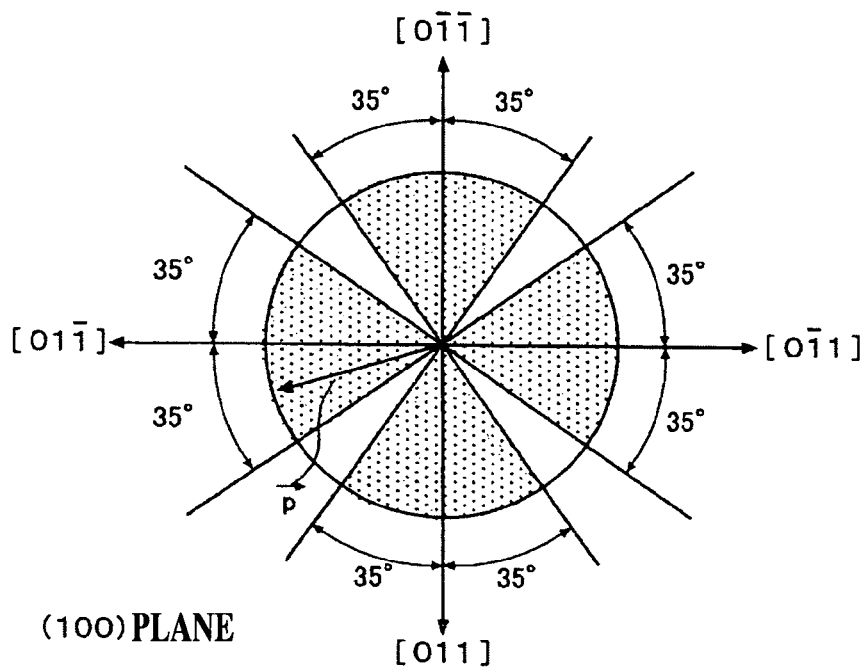
FIG. 2 This is an explanatory view showing effective regions of a shift angle β according to the present invention.
FIG. 3 This is an explanatory view showing a correspondence relationship between the usual notation and the notation in this description and claims with regard to the expressions of the directions.

Moreover, also when the [0-11] direction, the direction or the [0-1-1] direction is taken as the reference, the above-described surface defects which occur on the InAlAs epitaxial layer can be reduced by using the InP substrate in which the shift angle β is within the range of −35°<β<35°, in a similar way to the case that the [01-1] direction is taken as the reference. Specifically, the epitaxial layer having extremely good quality can be obtained by using the InP substrate in which the inclination direction (shift angle β) of the principal surface is within the hatched regions shown in FIG. 2.

Moreover, although the off angle of the InP substrate is set to 0.1° in the above-described embodiment, the off angle of the principal surface may be within a range of 0.05 to 0.2°. In such a way, the occurrence of the hillock defects on the surface of the epitaxial layer can be prevented effectively.

Furthermore, although the example where the InAlAs layer is epitaxially grown on the InP substrate is explained in the above-described embodiment, the present invention can be applied similarly also to the case that a III-V compound semiconductor layer (for example, InGaAs layer) other than the InAlAs layer is epitaxially grown on the InP substrate. Moreover, it is considered that the present invention is not limited to the InP substrate and that the present invention can be broadly applied to general epitaxial growth using other compound semiconductor substrates.

The invention claimed is:

1. A substrate for growing an Al-based compound semiconductor, which is an InP substrate in which a crystal surface inclined at a predetermined off angle with respect to a (100) plane is a principal plane, the substrate being used in a metal organic chemical vapor deposition method, wherein an angle made by a direction of a vector obtained by projecting a normal vector of the principal plane on the (100) plane and one direction of a [0-11] direction, a

[01-1] direction, a [011] direction and a [0-1-1] direction is less than 35°, and wherein the predetermined off angle is within a range of 0.05° to 0.2°.

2. An epitaxial growth method, comprising:

using an InP substrate for growing an Al-based compound semiconductor, the substrate comprising a principal plane inclined at a predetermined off angle with respect to a (100) plane, wherein an angle made by a direction of a vector obtained by projecting a normal vector of the principal plane on the (100) plane and one direction of a [0-11] direction, a [01-1] direction, a [011] direction and a [0-1-1] direction is less than 35°; and epitaxially growing Al-based compound semiconductor layer on the substrate by a metal organic chemical vapor deposition method, wherein the predetermined off angle is within a range of 0.05° to 0.2°.

3. The substrate as claimed in claim 1, wherein the Al-based compound semiconductor is an InAlAs epitaxial crystal.

4. The epitaxial growth method as claimed in claim 2, wherein the Al-based compound semiconductor is an InAlAs epitaxial crystal.

* * * * *